United States Patent
Tomishima

(10) Patent No.: US 6,859,384 B2
(45) Date of Patent: Feb. 22, 2005

(54) SEMICONDUCTOR MEMORY DEVICE HAVING TWO-TRANSISTOR, ONE-CAPACITOR TYPE MEMORY CELLS OF HIGH DATA HOLDING CHARACTERISTIC

(75) Inventor: Shigeki Tomishima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 163 days.

(21) Appl. No.: 10/174,995

(22) Filed: Jun. 20, 2002

(65) Prior Publication Data

US 2003/0117832 A1 Jun. 26, 2003

(30) Foreign Application Priority Data

Dec. 21, 2001  (JP) ........................................ 2001-389986

(51) Int. Cl.[7] .............................................. G11C 11/24
(52) U.S. Cl. .................... 365/149; 365/189.01; 365/196
(58) Field of Search ................................ 365/149, 196, 365/207, 230.06; 265/189.01

(56) References Cited

U.S. PATENT DOCUMENTS

| | | |
|---|---|---|
| 4,203,159 A | 5/1980 | Wanlass |
| 4,896,294 A | 1/1990 | Shimizu et al. |
| 5,007,022 A | 4/1991 | Leigh |
| 5,010,519 A * | 4/1991 | Yoshimoto et al. .......... 365/149 |
| 5,923,593 A | 7/1999 | Hsu et al. |
| 5,966,341 A * | 10/1999 | Takahashi et al. ...... 365/230.03 |
| 6,169,684 B1 * | 1/2001 | Takahashi et al. ............ 365/49 |
| 6,256,221 B1 | 7/2001 | Holland et al. |
| 6,256,256 B1 | 7/2001 | Rao |
| 6,288,925 B1 * | 9/2001 | Kitsukawa et al. ............ 365/63 |
| 6,449,182 B1 * | 9/2002 | Ooishi .......................... 365/63 |
| 6,449,204 B1 * | 9/2002 | Arimoto et al. ............. 365/222 |
| 6,452,859 B1 * | 9/2002 | Shimano et al. ........ 365/230.06 |
| 6,671,213 B2 * | 12/2003 | Ohtani ........................ 365/200 |

OTHER PUBLICATIONS

"Transparent–Refresh DRAM (TReD) Using Dual–Port DRAM Cell", Sakurai et al., IEEE 1988, *Custom Integrated Circuits Conference*, pp. 4.3.1–4.3.4.

* cited by examiner

*Primary Examiner*—David Nelms
*Assistant Examiner*—Long Tran
(74) *Attorney, Agent, or Firm*—McDermott Will & Emery LLP

(57) ABSTRACT

An active region which forms two transistors included in a memory cell is arranged to have a strip shape along a predetermined axis crossing first and second bit lines at less than 90 degrees, whereby it is possible to reduce a junction area corresponding to a connection node of connecting the two transistors between the active region and a substrate and to reduce a leak current.

9 Claims, 15 Drawing Sheets

SEMICONDUCTOR MEMORY DEVICE HAVING TWO-TRANSISTOR, ONE-CAPACITOR TYPE MEMORY CELLS OF HIGH DATA HOLDING CHARACTERISTIC

BACKGROUND OF THE INVENTION

1. Field of the Invention

The present invention relates to a semiconductor memory device, and particularly relates to a semiconductor memory device having two-transistor, one-capacitor type dual-port memory cells.

2. Description of the Background Art

While a conventional DRAM (Dynamic Random Access Memory) generally consists of 1-transistor, one-capacitor type memory cells, various types of memory configurations have been developed to meet demand for mass storage and speed up.

In a case of the memory cells of a DRAM, for example, two-transistor, one-capacitor type memory cells are proposed so as to enable high-rate data access in the same manner as the memory cells of an SRAM (Static Random Access Memory).

Since the present invention is intended at a two-transistor, one-capacitor type memory cell, the two-transistor, one-capacitor type memory cell will be also simply referred to as "memory cell" in the following description.

FIGS. 16A and 16B are block diagrams of a conventional two-transistor, one-capacitor type memory cell.

Referring to FIG. 16A, two transistors NTr and RTr and one capacitor CC are provided per memory cell. Word lines NWL and RWL arranged in parallel are connected to the gates of transistors NTr and RTr, respectively. In addition, bit lines RBL and NBL arranged in parallel cross two word lines NWL and RWL. Transistors RTr and NTr are connected in series between bit lines RBL and NBL through a node NC. Further, node NC is connected to capacitor CC which holds a charge as data.

In this two-transistor, one-capacitor type memory cell, if word line NWL is set at, for example, "H" level, data can be written or read from bit line NBL side to capacitor CC. If word line RWL is set at "H" level, data can be written or read from bit line RBL side to capacitor CC. It is, therefore, possible for two systems to simultaneously access one memory cell and to thereby perform high-rate data access in an entire chip.

Here, the cell layout of the conventional two-transistor, one-capacitor type memory cell will be considered.

FIG. 16B is a layout view of the memory cell described in FIG. 16A.

Referring to FIG. 16B, the pattern of an active region ENB which forms two transistors RTr and NTr arranged in series between two bit lines RBL and NBL will be considered.

Here, in order to connect word lines NWL and RWL to the gates of transistors NTr and RTr, respectively, and to arrange word lines NWL and RWL orthogonal to the bit lines, it is necessary to form active region ENB which forms the transistors into an S-shaped pattern.

If this pattern is formed, it is necessary to secure an active region having a minimum predetermined distance between bit lines RBL and NBL so as to provide two bit lines RBL and NBL in parallel without causing a short-circuit therebetween.

According to such a configuration, since the area of a junction section, which corresponds to node NC, between the active region and a substrate is large, the charge held by capacitor CC are leaked to the substrate from this junction section. That is, junction leak current is excessively generated, with the result that so-called memory cell refresh time is disadvantageously shortened.

SUMMARY OF THE INVENTION

It is an object of the present invention to provide a two-transistor, one-capacitor type memory cell capable of improving the data holding characteristic of the memory cell by reducing the junction leak current stated above.

It is another object of the present invention to provide a semiconductor memory device having a suited chip layout constituted by using two-transistor, one-capacitor type memory cells.

According to one aspect of the present invention, a semiconductor memory device including: a memory array in which a plurality of memory cells are arranged in a matrix, wherein the memory array includes a plurality of first and second bit lines provided to correspond to memory cell columns, respectively, and a plurality of first and second word lines provided to correspond to memory cell rows, respectively; the semiconductor memory device further including: a plurality of first sense amplifiers connected to at least one of the plurality of first bit lines in a region adjacent to the memory array in a row direction, respectively; and a plurality of second sense amplifiers connected to at least one of the plurality of second bit lines in a region opposite to the plurality of first sense amplifiers across the memory array, respectively; and wherein each of the plurality of memory cells has a first transistor connected between corresponding one of the plurality of first bit lines and a storage node, a second transistor connected between corresponding one of the plurality of second bit lines and the storage node, and a capacitor connected to the storage node to hold charges as data.

Accordingly, the main advantage of the present invention is in that it is possible to secure the sufficient wiring pitch of each internal circuit of each of the first and second sense amplifier and to thereby facilitate layout design by providing the first sense amplifier which is connected to the first bit line corresponding to the first transistor and which inputs and outputs data to and from each memory cell and the second sense amplifier which is connected to the second bit line corresponding to the second transistor and which inputs and outputs data to and from each memory cell independently on the left and right, respectively.

According to another aspect of the present invention, a semiconductor memory device including: a memory array including a plurality of memory cells arranged in a matrix, wherein each of the plurality of memory cells includes: a capacitor storing data by accumulating charges; and first and second transistors provided on a shared active region, respectively, and electrically connected between a storage node connected to the capacitor, and a first bit line and between the storage node and a second bit line the first and second lines being arranged to correspond to memory cell columns in parallel to each other, respectively, and wherein gates of the first and second transistors are connected to first and second word lines provided to correspond to memory cell rows along a direction crossing with the first and second bit lines, respectively, and the shared active region is arranged to have an elongate shape along a predetermined axis crossing with the first and second bit lines so as to form a predetermined angle of less than 90 degrees with respect to the first and second bit lines.

Accordingly, another advantage of this invention is in that it is possible to reduce the junction area corresponding to the connection node connecting the two transistors between the active region and the substrate and to reduce leak current by arranging the active region which forms two transistors included in each memory cell to have an elongate shape along the predetermined axis crossing the first and second bit lines at an angle of less than 90 degrees.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in detail with reference to the drawings. Same or corresponding sections are denoted by the same reference symbols throughout the drawings and will not be described repeatedly.

(First Embodiment)

Figure 1A:
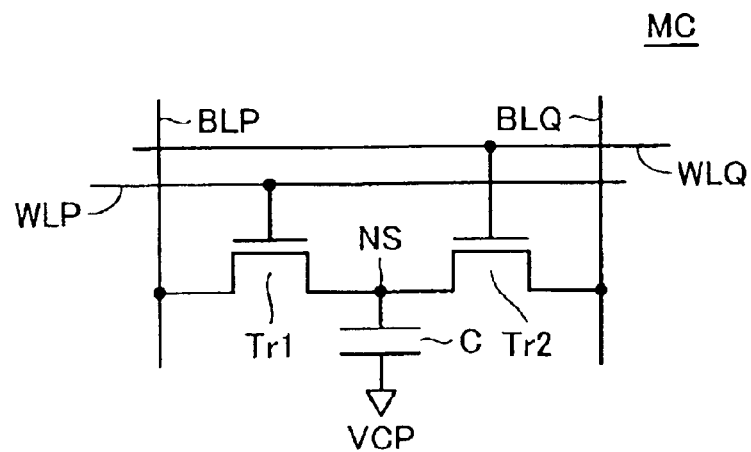
FIG. 1A is a circuit diagram of a two-transistor, one-capacitor type memory cell MC according to the first embodiment of the present invention.

Referring to FIG. 1A, a memory cell MC includes transistors Tr1 and Tr2 and a capacitor C. Transistors Tr1 and Tr2 are connected in series between bit lines BLP and BLQ through a node NS. The gates of transistors Tr1 and Tr2 are connected to word lines WLP and WLQ, respectively. In addition, node NS is electrically coupled to capacitor C. The other terminal of capacitor C is electrically connected to a cell plate voltage VCP.

If word line WLP is selected, capacitor C is connected to bit line BLP through transistor Tr1. If word line WLQ is selected, capacitor C is connected to bit line BLQ through transistor Tr2. A path on which bit line BLP is connected to capacitor C through transistor Tr1 will be referred to as "port P" and a path on which bit line BLQ is connected to capacitor C through transistor Tr2 will be referred to as "port Q" hereinafter.

Figure 1B:
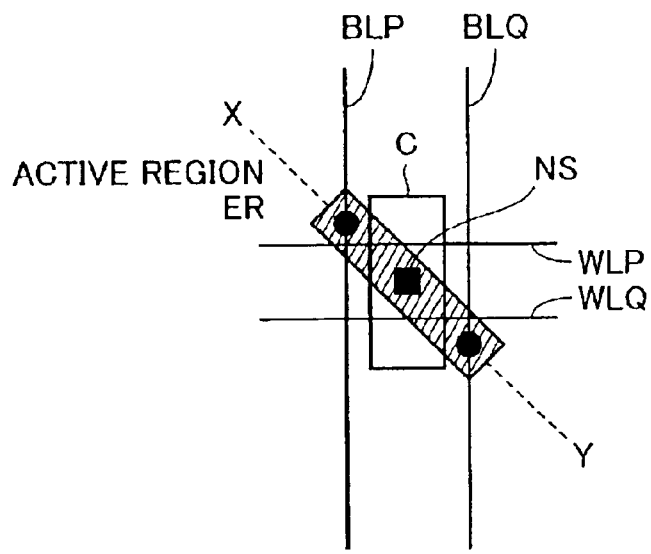
FIG. 1B is a layout view of memory cell MC according to the first embodiment of the present invention.

Referring to FIG. 1B, word lines WLP and WLQ are arranged in parallel to each other. Bit lines BLP and BLQ are arranged in parallel to each other along a direction in which bit lines BLP and BLQ cross word lines WLP and WLQ.

Here, between bit lines BLP and BLQ, an active region ER which forms transistors Tr1 and Tr2 connected in series is arranged to have an elongate shape along a predetermined axis so as to form a predetermined angle of less than 90 degrees at which elongate-shaped active region ER crosses BLP and BLQ, respectively. Active region ER has a rectangular shape herein.

Figure 1C:
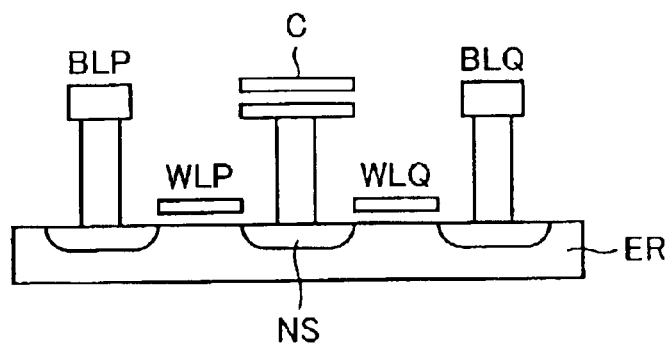
FIG. 1C is a cross-section view of memory cell MC according to the first embodiment of the present invention.

FIG. 1C shows a cross-sectional view showing that a memory cell is cut along a line X-Y in the direction of the predetermined axis of the active region in FIG. 1B.

Referring to FIG. 1C, two transistors Tr1 and Tr2 are formed on active region and arranged on the left and right of connection node NS which is electrically connected to capacitor C, respectively.

With this configuration, the active region is arranged not in an S-shaped manner but along the predetermined axis, thereby making it possible to reduce the area of the junction section which corresponds to connection node NS between the active region and the substrate.

Accordingly, by reducing the area of the junction section corresponding to connection node NS between the active region and the substrate as much as possible, it is possible to reduce leak current and to improve the data holding characteristic of the memory cell. If the predetermined angle at which bit lines cross the predetermined axis is set at 45 degrees, it is possible to minimize the area of active region ER and to minimize the leak current.

According to this configuration, a COB (Cell Over Bitline) structure in which the memory cell is located over the bit lines is shown. However, the memory cell structure is not limited to the COB structure but may be a stack type three-dimensional cell structure, a trench type cell structure or a CUB (Cell Under Bitline) structure.

(Second Embodiment)

The second embodiment is intended to show the preferred chip layout of a DRAM memory chip constituted out of memory cells MC described in the first embodiment.

Figure 2:
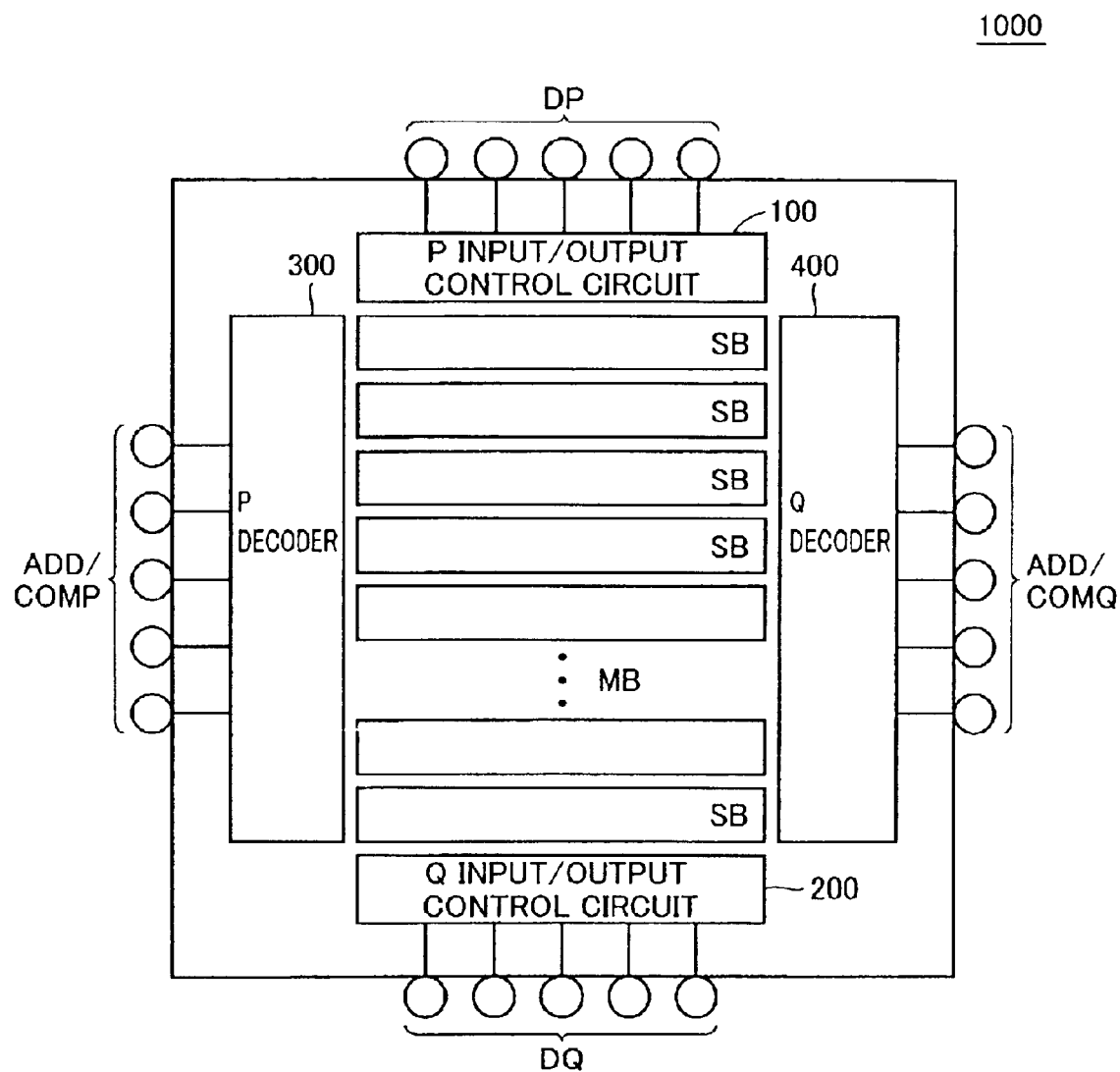
FIG. 2 is an overall block diagram of a semiconductor memory device 1000 according to the second embodiment of the present invention.

Referring to FIG. 2, a semiconductor memory device 1000 includes a P input/output control circuit 100, a Q input/output control circuit 200, a P decoder 300, a Q decoder 400, port P input/output pins DP, port Q input/output pins DQ, port P address command pins ADD/COMP, port Q address command pins ADD/COMQ, and a main block MB. Main block MB includes a plurality of sub-memory blocks SB. Main block MB has a plurality of memory arrays each consisting of a plurality of memory cells MC arranged in a matrix.

P input/output control circuit 100 controls data input/output between port P input/output pins DP and memory cells MC using ports P of memory cells MC, respectively. In addition, Q input/output control circuit 200 controls data input/output between port Q input/output pins DQ and memory cells MC using ports Q of memory cells MC, respectively.

P decoder 300 executes a row selection and a column selection so that data is written and read to and from memory cells MC in each sub-memory block SB using each port P in response to an address and a command inputted from each port P address command pin ADD/COMP. Q decoder 400 executes a row selection and a column selection so that data is written and read to and from memory cells MC in each sub-memory block SB using each port Q in response to an address and a command inputted from each port Q address command pin ADD/COMPQ.

Figure 3:
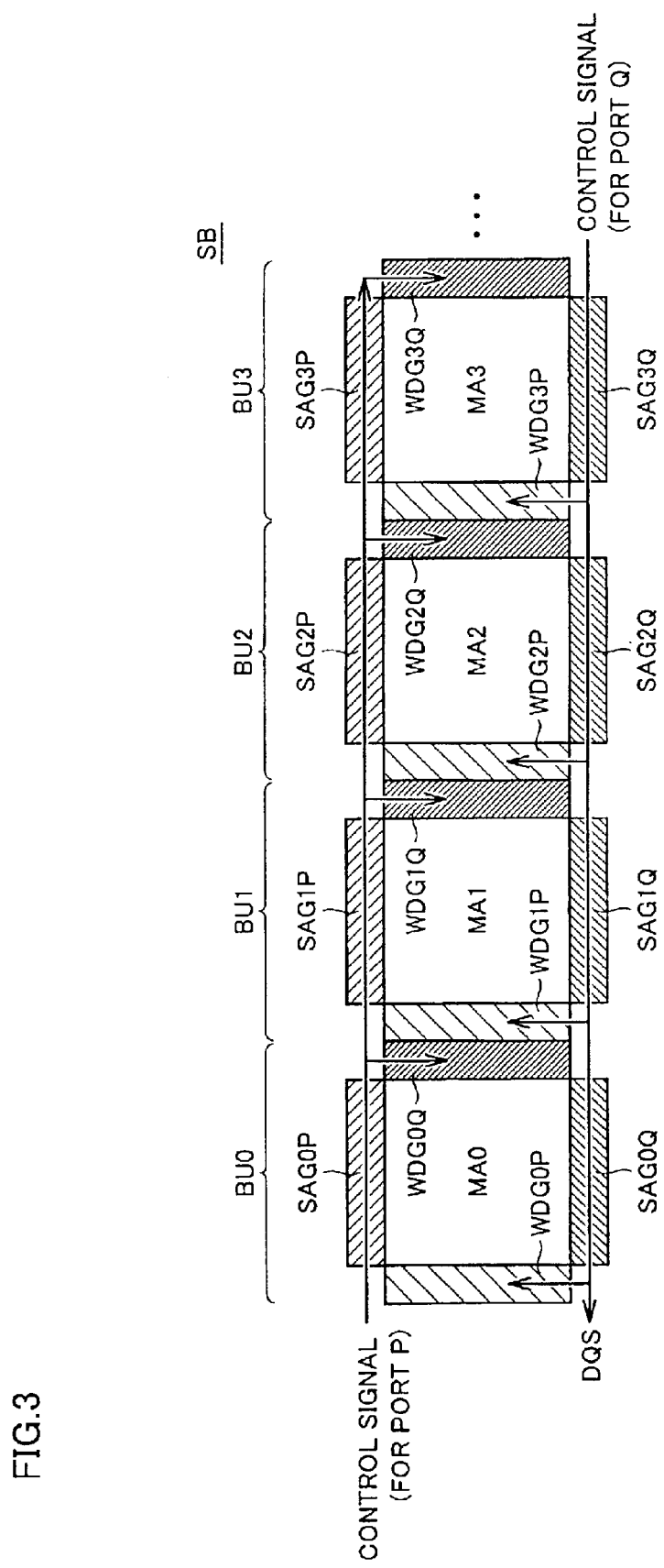
FIG. 3 is a block diagram of a sub-memory block SB.

Referring to FIG. 3, each sub block SB includes a plurality of block units BU0 to BUm (m: natural number) (each of which will be generally referred to as "block unit BU" hereinafter). By way of example, the configuration of sub-block SB which includes block units BU0 to BU3 (m=3) will be described.

If m=3, sub-memory block SB is constituted to arrange block units BU0 to BU3 in the column direction.

The configuration of block unit BU will be described while taking block unit BU0 as an example.

Referring to FIG. 3, word driver zones WDG0P and WDG0Q for controlling the word lines and sense driver zones SAG0P and SAG0Q for controlling the bit lines are arranged in the four sides of a memory array MA0, respectively. Other block units BU1 to BU3 are the same in configuration as block unit BU0, memory arrays MA0 to MA3, word drivers WDG0P to WDG3P, word drivers WDG0Q to WDG3Q, sense amplifiers SAG0P to SAG3P and sense amplifiers SAG0Q to SAG3Q included in sub-memory block SB will be generally referred to as "memory arrays MA", "word drivers WDGP", "word drivers WDGQ", "sense amplifiers SAGP" and "sense amplifiers SAGQ", respectively.

Word driver zone WDG0P controls the word line connected to the gate of the port P side transistor in each memory cell MC. Word driver zone WDG0Q controls the word line connected to the gate of the port Q side transistor in each memory cell MC.

Sense amplifier zone SAG0P is connected to P input/output control circuit 100 through an input/output line used for data transfer and controls data write and read to and from each memory cell MC using port P. Sense amplifier zone SAG0Q is connected to Q input/output control circuit 200 through an input/output line used for data transfer and controls data write and read to and from each memory cell MC using port Q.

In addition, as a layout configuration, word driver zones WDG0P and WDG0Q are arranged on the both sides of memory array MA0, respectively, and sense amplifier zones SAG0P and SAG0Q are arranged on the other both sides of memory array MA0, respectively with memory array MA0 put therebetween.

Since the layout configurations of other block units BU are the same as that of block unit BU0, they will not be repeatedly described herein in detail.

Further, control signals controlling sense amplifier zones SAGP and SAGQ and word driver zones WDGP and WDGQ are inputted from directions different between P and Q ports, respectively.

Figure 4:
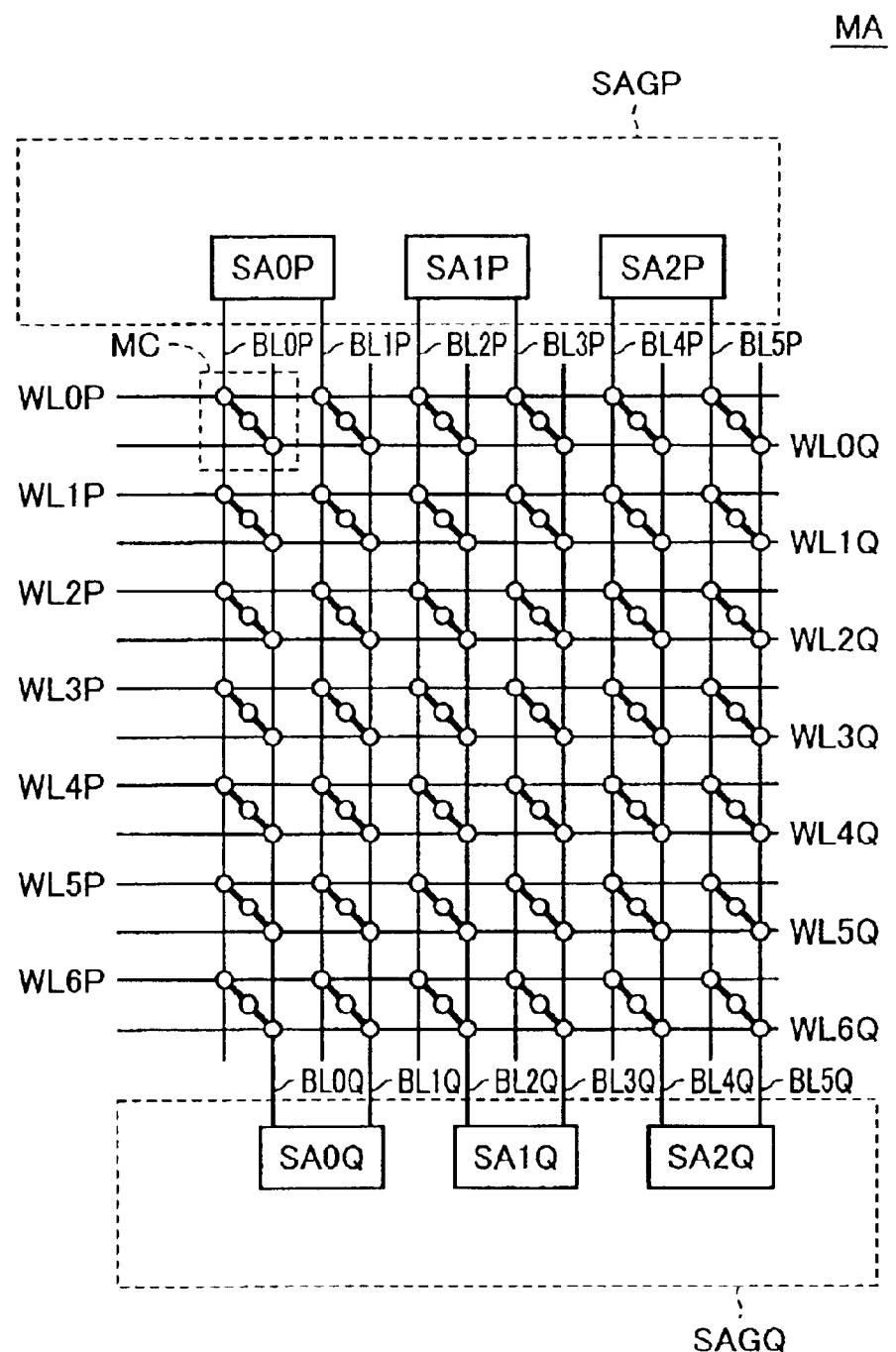
FIG. 4 is an array block diagram of a memory array MA.

FIG. 4 is an array block diagram of memory array MA.

Memory cells MC are arranged in rows and columns, word lines WL0P to WL6P (each of which will be generally referred to as "WLP" hereinafter) are arranged to correspond to port P transistors of memory cells MC arranged in rows, respectively, and word lines WL0Q to WL6Q (each of which will be generally referred to as "WLQ" hereinafter) are arranged to correspond to port Q transistors of memory cells MC arranged in rows, respectively. Further, bit lines BL0P to BL5P (each of which will be generally referred to as "BLP" hereinafter) are arranged to correspond to ports P of memory cells MC arranged in columns, respectively and bit lines BL0Q to BL5Q (each of which will be generally referred to as "BLQ" hereinafter) are arranged to correspond to ports Q of memory cells MC arranged in columns, respectively.

Each of sense amplifiers SA0P to SA2P (each of which will be generally referred to as "SAP" hereinafter) included in sense amplifier zone SAGP are connected to two adjacent port P bit lines BLP and form a so-called folded bit line configuration. Sense amplifier SA0P is, for example, connected to bit lines BL0P and BL1P. Since the configurations of other sense amplifiers SA1P and SA2P are the same as that of sense amplifier SA0P, they will not be repeatedly described herein in detail.

The same thing is true for sense amplifier zone SAGQ, and each of sense amplifiers SA0Q to SA2Q (each of which will be generally referred to as "SAQ" hereinafter) included in sense amplifier zone SAGQ is connected to two adjacent port Q bit lines BLQ. Sense amplifier SA0Q is, for example, connected to bit lines BL0Q and BL1Q. Since the configurations of other sense amplifiers SA1Q and SA2Q are the same as that of sense amplifier SA0Q, they will not be repeatedly described herein in detail. While part of bit lines BLP and BLQ and word lines WLP and WLQ and the like have been described for the brevity of description, the present invention is not limited thereto.

By adopting such folded bit line configurations, it is possible to decrease the influence of bit line noise. In addition, in case of a mixture type DRAM chip, it is possible to easily deal with the reduction of a capacitance change (granularity) per important sub-block unit. The configurations are also applicable to multiple-bank configurations.

Figure 5:
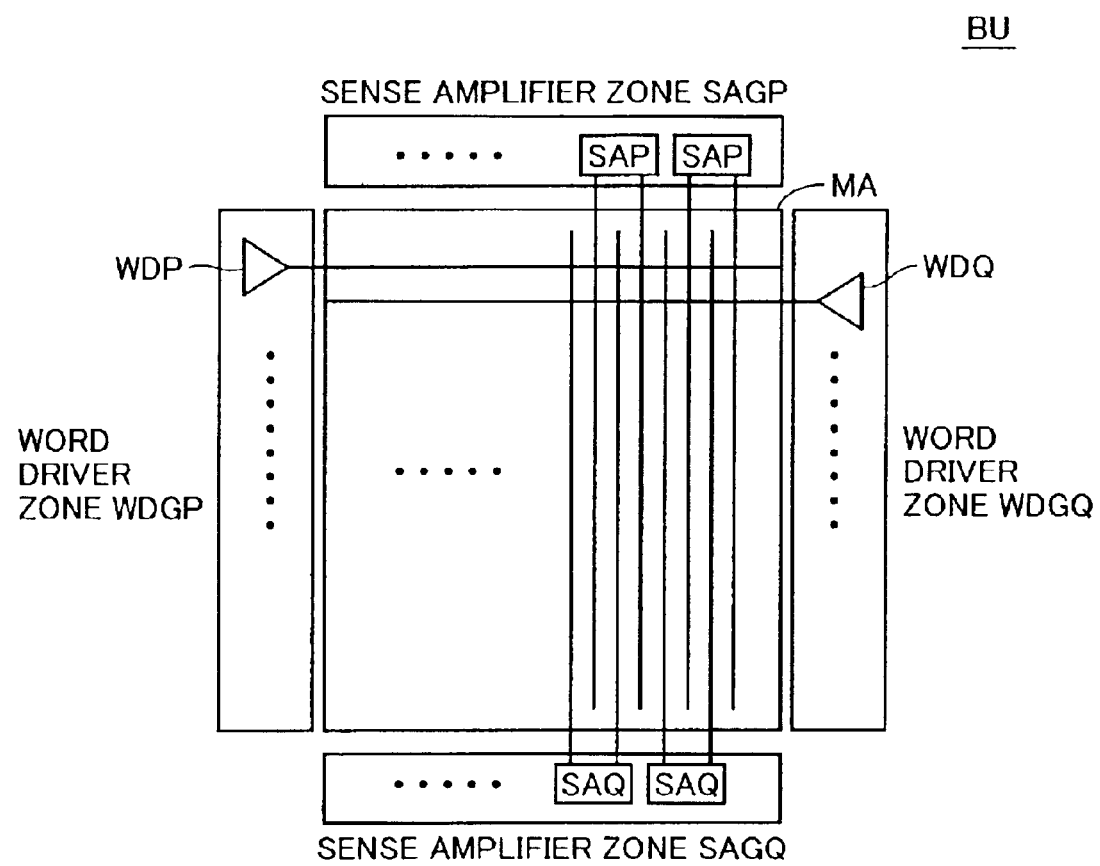
FIG. 5 is a view showing the relationship among sense amplifier zones SAGP and SAGQ, word driver zones WDGP and WDGQ and memory array MA in a block unit BU.

Referring to FIG. 5, word driver zone WDGP includes a plurality of word drivers WDP. A plurality of word line drivers WDP are electrically coupled to a plurality of word lines corresponding to port P transistors of memory cells MC arranged in rows as described in FIG. 4, respectively. In addition, word driver zone WDGQ includes a plurality of word drivers WDQ. A plurality of word line drivers WDQ are electrically coupled to a plurality of word lines corresponding to port Q transistors of memory cells MC arranged in rows, respectively. It is noted that word drivers WDP and WDQ are general terms of port P and Q word drivers, respectively.

As described above, sense amplifier zone SAGP includes a plurality of sense amplifiers SAP each of which is connected to two bit lines out of a plurality of bit lines arranged to correspond to ports P of memory cells MC arranged in columns, respectively. Sense amplifier zone SAGQ includes a plurality of sense amplifiers SAQ each of which is connected to two bit lines out of a plurality of bit lines arranged to correspond to ports Q of memory cells MC arranged in columns, respectively.

Referring back to FIG. 2, a port P sense amplifier control signal PS is generated by P decoder 300 based on an address and a command and outputted to each sub-memory block SB for executing a column selection. In addition, a port Q sense amplifier control signal QS is generated by Q decoder 400 based on an address and a command and outputted to each sub-memory block SB for executing a column selection.

Figure 6:
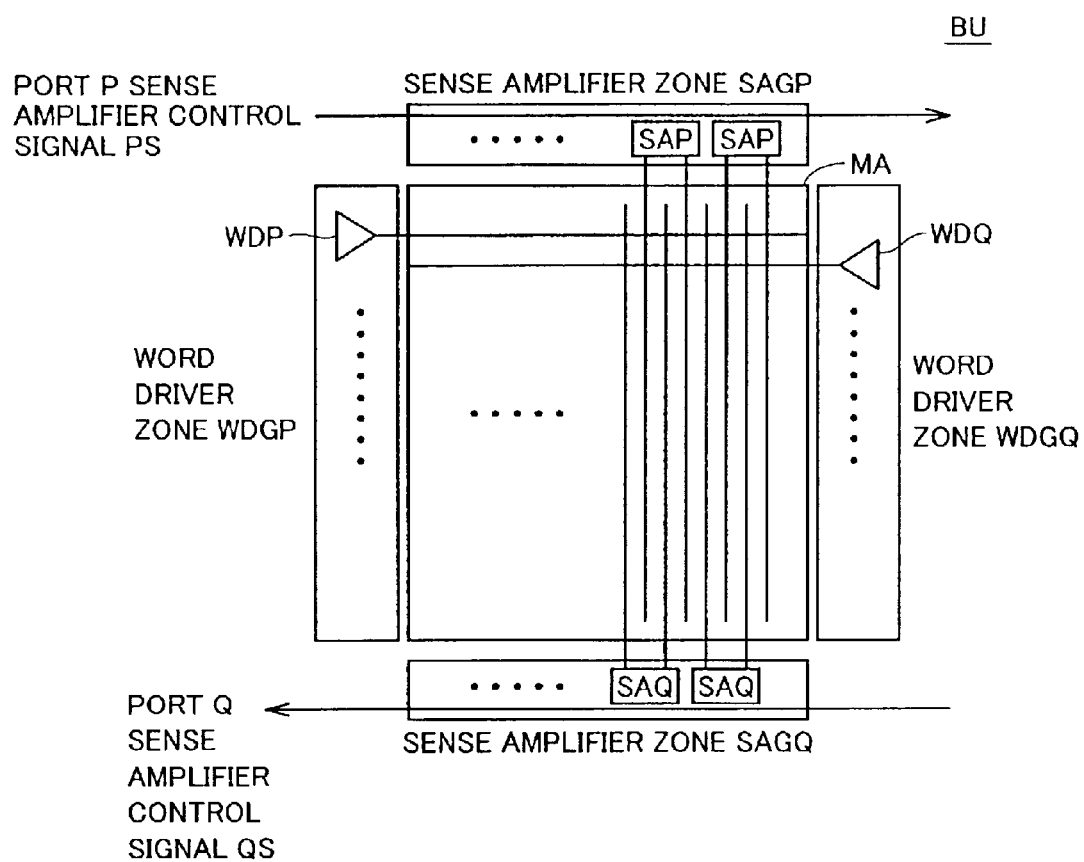
FIG. 6 is a view showing the signal paths of a port P sense amplifier control signal PS and a port Q sense amplifier control signal QS inputted into sense amplifier zones SAGP and SAGQ for executing a column selection in block unit BU, respectively.

Referring to FIG. 6, port P sense amplifier SAP in selected block unit BU is selected in accordance with sense amplifier control signal PS generated by P decoder 300 and selected port P sense amplifier SAP executes data read and write using ports P. Likewise, port Q sense amplifier SAQ in selected block unit BU is selected in accordance with sense amplifier control signal QS generated in Q decoder 400 and selected port Q sense amplifier SAQ executes data read and write using ports Q.

In this way, sense amplifier zones SAGP and SAGQ can independently control data read and write from and to memory cells MC using ports P and Q in accordance with sense amplifier control signals PS and PQ, respectively.

Further, by constituting port P sense amplifier zone SAGP and port Q sense amplifier zone SAGQ to be separated from each other, it is possible to secure a sufficient wiring pitch between sense amplifiers SAP and between sense amplifiers SAQ included in sense amplifier zones SAGP and SAGQ without increasing the number of wirings, respectively. In other words, this facilitates the layout of sense amplifiers SAP and SAQ.

A port P driver control signal DPS is generated by P decoder 300 based on an address and a command and outputted to each sub-memory block SB. In addition, a port Q driver control signal DQS is generated by Q decoder 400 based on an address and a command and outputted to each sub-memory block SB.

Figure 7:
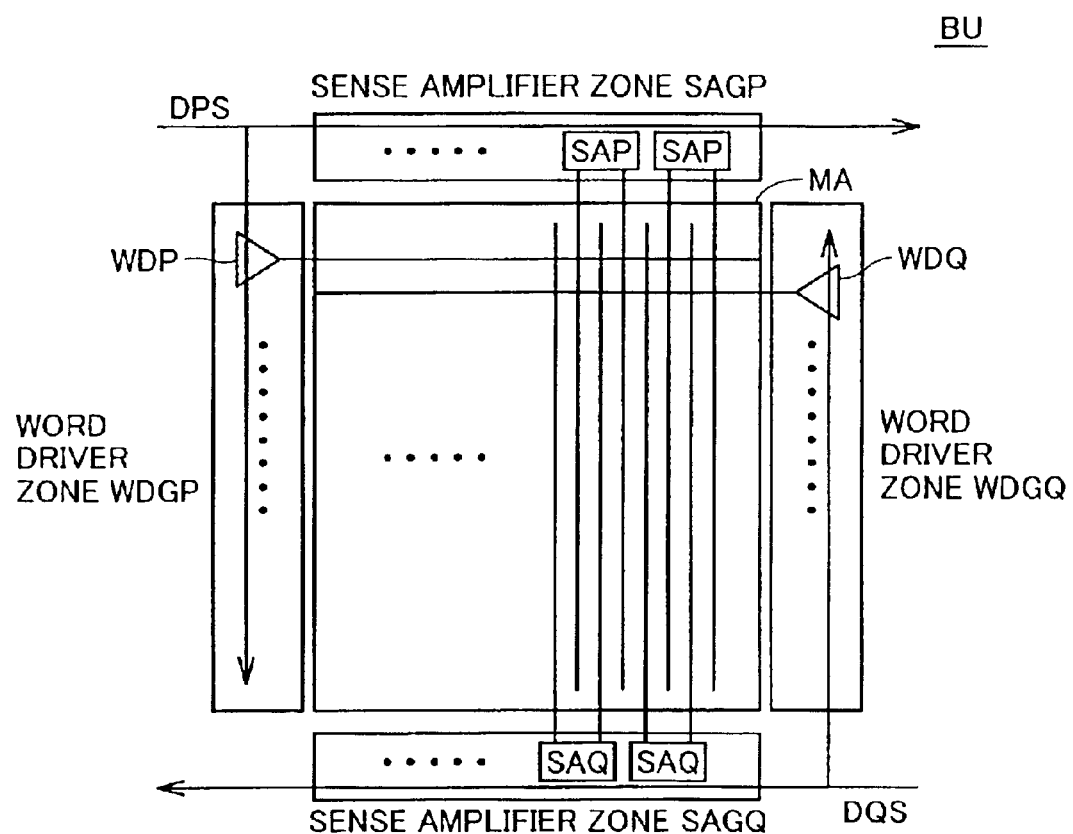
FIG. 7 is a view showing the signal paths of a port P driver control signal DPS and a port Q driver control signal DQS inputted into word driver zones WDGP and WDGQ for executing a row selection in block unit BU, respectively.

Referring to FIG. 7, driver control signal DPS generated by P decoder 300 is inputted into word driver zone WDGP in each block unit BU. Word driver zone WDGP selects one of port P word drivers WDP and activates the gates of port P transistors for reading and writing data. In addition, driver control signal DQS generated by Q decoder 400 is inputted into word driver zone WDGQ in each block unit BU. Word driver zone WDGQ selects one of port Q word drivers WDQ and activates the gates of port Q transistors for reading and writing data.

In this way, word driver zones WDGP and WDGQ can independently control port P and Q side transistors of memory cells MC for reading and writing data in accordance with driver control signals DPS and DQS, respectively.

Further, by constituting port P word driver zone WDGP and port Q word driver zone WDGQ to be separated from each other, it is possible to secure a sufficient wiring pitch between word drivers WDP and between word drivers WDQ included in word driver zones WDGP and WDGQ without increasing the number of wirings, respectively. In other words, this facilitates the layout of word drivers WDP and WDQ.

Figure 8:
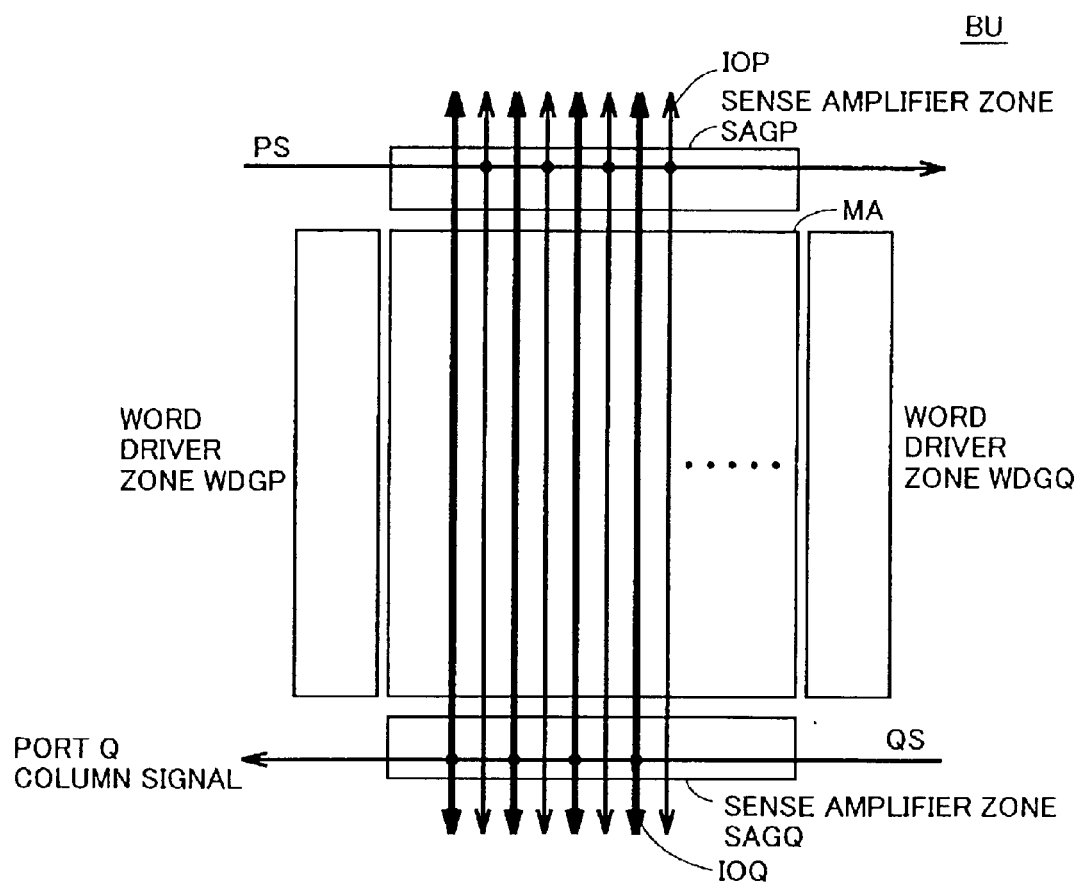
FIG. 8 is a view showing the layout configuration of input/output lines IOP and IOQ for transferring data in each of sense amplifier zones SAGP and SAGQ and P input/output control circuit 100 and Q input/output control circuit 200.

Referring to FIG. 8, each input/output line IOP transfers data corresponding to port P and each input/output line IOQ transfers data corresponding to port Q.

Input/output lines IOP are arranged to correspond to bit lines BLP constituting the same columns, respectively, in each sub-memory block SB and input/output lines IOQ are arranged to correspond to bit lines BLQ constituting the same columns, respectively, in each sub-memory block SB.

Further, input/output lines IOP and IOQ are alternately arranged between P input/output control circuit 100 and Q input/output control circuit 200 in parallel to the bit lines.

While various layout configurations in sub-memory block SB have been described above, the layout configuration between sub-memory blocks SB will next be described.

Figure 9:
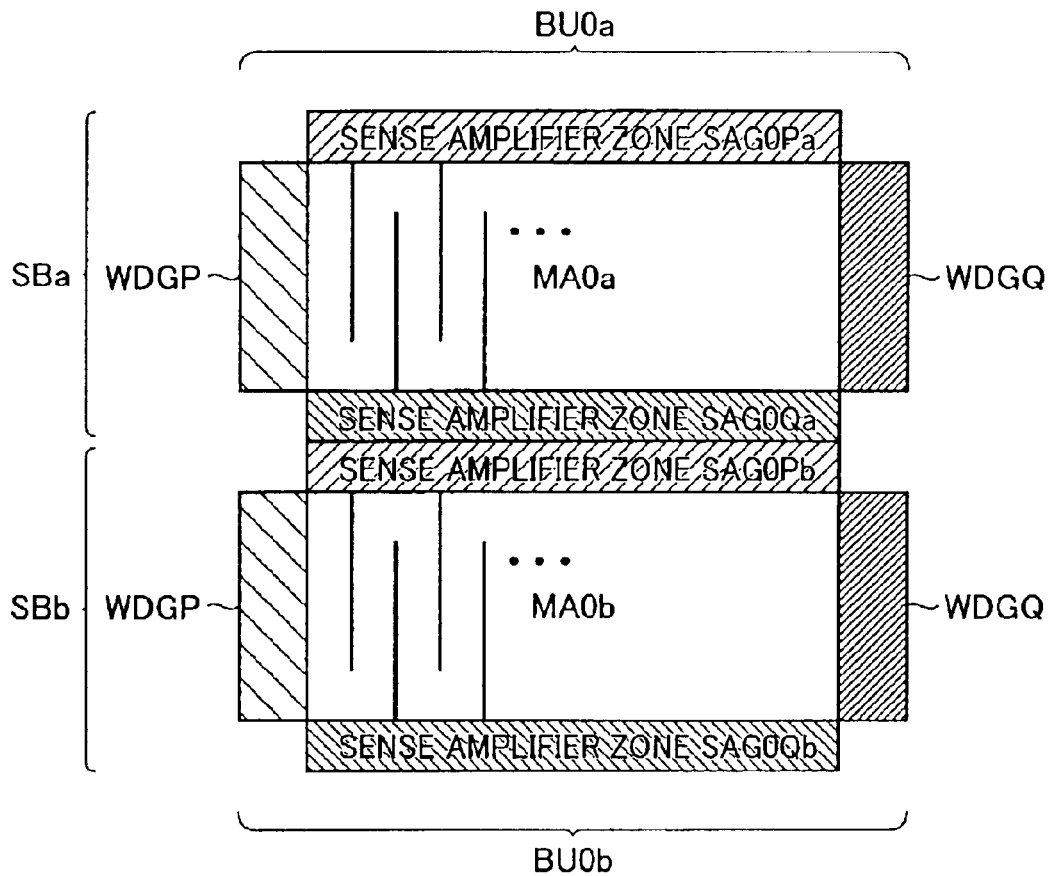
FIG. 9 is a view showing the layout configuration between sub-memory blocks SBa and SBb by way of example.

Referring to FIG. 9, block units BU0a and BU0b included in sub-memory blocks SBa and SBb, respectively will be described.

Block unit BU0a includes sense, amplifier zones SAG0Pa and SAG0Qa, a memory array MA0a, and word driver zones WDGP and WDGQ.

Further, block unit BU0b includes sense amplifier zones SAG0Pb and SAG0Qb, a memory array MA0b, and word driver zones WDGP and WDGQ. Since the arrangement relationship between the blocks is the same as that already described above, it will not be repeatedly described herein in detail.

Namely, the layout configuration between adjacent sub-memory blocks SBa and SBb is such that sense amplifier zones SAGP and SAGQ are arranged between two memory arrays MA for respective memory arrays MA. The same thing is true for the layout configuration between other sub-memory blocks SB.

Semiconductor memory device 1000 in the second embodiment of the present invention can independently control ports P and Q of respective memory cells MC. Further, by providing port P and Q sense amplifier zones SAGP and SAGQ and word driver zones WDGP and WDGQ independently of one another, it is possible to secure sufficient pitches between sense amplifiers SAP, between sense amplifiers SAQ, between word drivers WDP and between word drivers WDQ, respectively, thereby facilitating layout.

(Third Embodiment)

The third embodiment of the present invention is intended to further reduce a layout area.

Figure 10:
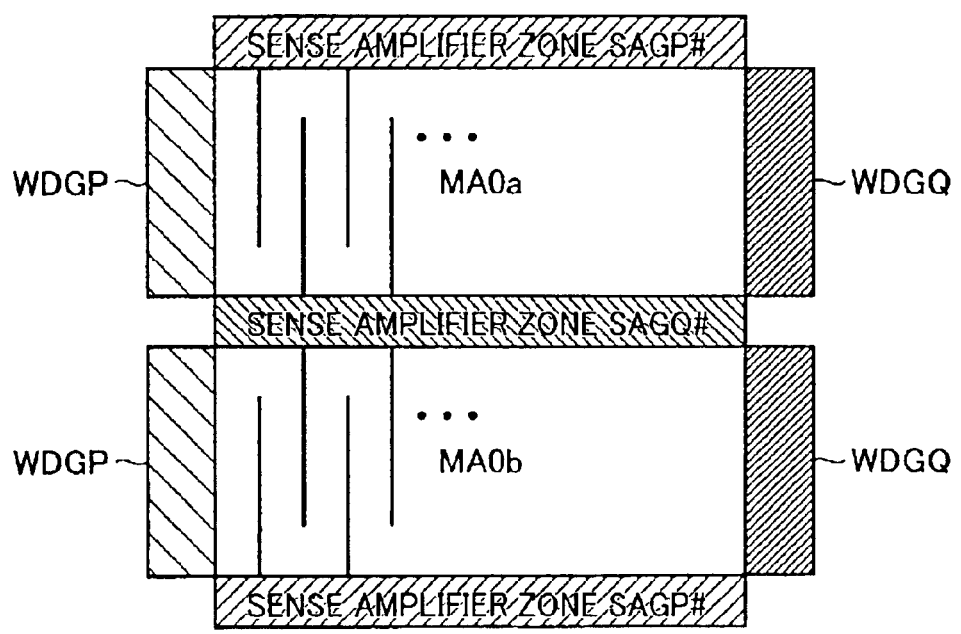
FIG. 10 is a view showing the layout configuration of sense amplifier zones SAGP# and SAGQ# according to the third embodiment of the present invention which can replace sense amplifier zones SAGP and SAGQ described in the second embodiment, respectively.

Referring to FIG. 10, sense amplifier zones SAGP# and SAGQ# differ from sense amplifier zones SAGP and SAGQ described with reference to FIG. 9 as follows. Sense amplifier zones SAGP and SAGQ are provided to be dedicated to respective block units BU. Each of sense amplifier zones SAGP# and SAGQ# is provided as a sense amplifier zone common to two adjacent memory arrays MA between adjacent sub-memory blocks SB.

Sense amplifier zone SAGQ# is provided as a sense amplifier zone common to adjacent memory arrays MA0a and MA0b. Specifically, although not shown therein, bit lines BLQ of two adjacent memory arrays MA corresponding to the same column are provided in common for one sense amplifier and data write and read are executed. The same thing is true for sense amplifier zone SAGP#.

By adopting this configuration, therefore, it is possible to reduce the area of the sense amplifier zones which occupy an entire chip and to reduce a layout area as a whole.

The word driver zones will next be described.

Figure 11:
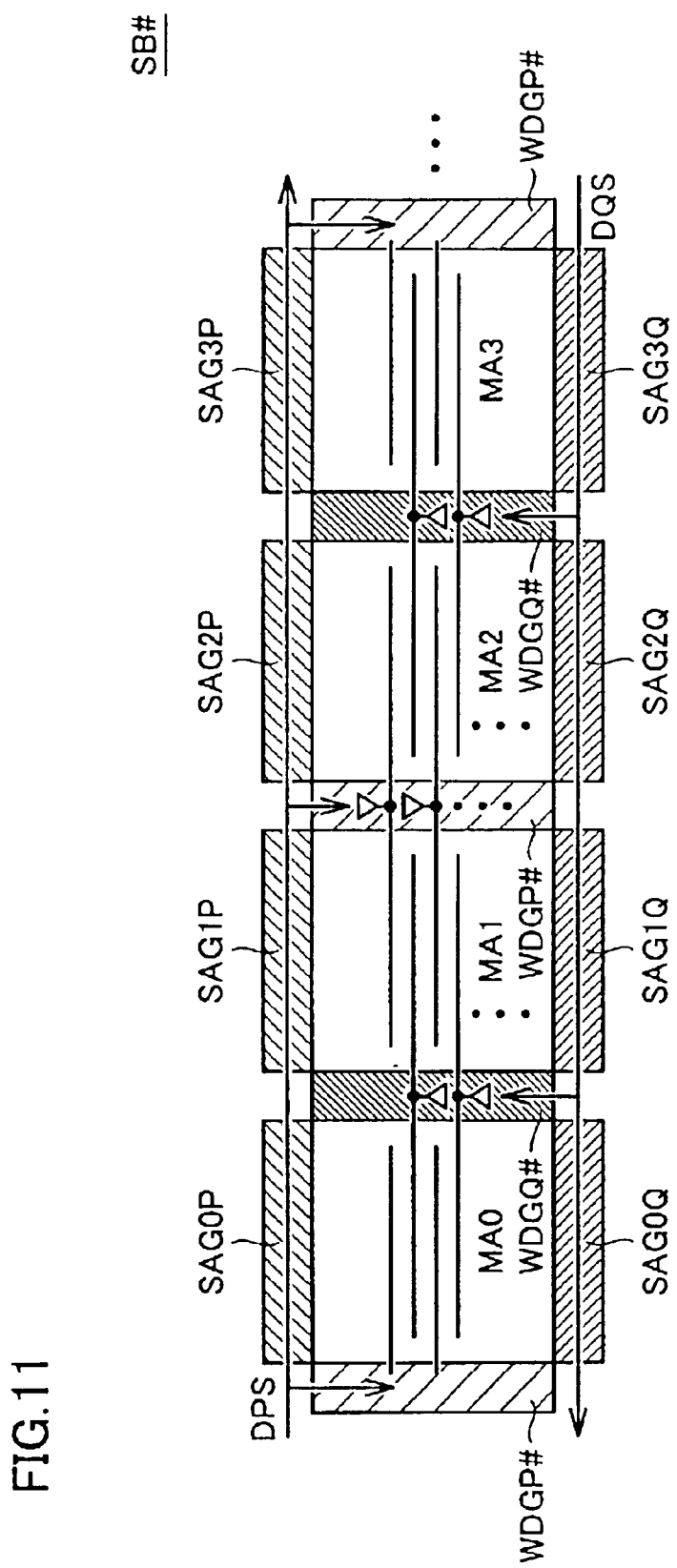
FIG. 11 is a view showing a sub-memory block SB# according to the third embodiment of the present invention.

Referring to FIG. 11, in sub-memory block SB#, word driver zones WDGP and WDGQ described in the second embodiment are replaced by word driver zones WDGP# and WDGQ# according to the third embodiment of the present invention, respectively. It is noted that word driver zones WDGP# and WDGQ# are general terms of port P and Q word driver zones, respectively.

Word driver zones WDGP# and WDGQ# differ from word driver zones WDGP and WDGQ in that word driver zones WDGP and WDGQ are provided to be dedicated to each block unit BU and word driver zones WDGP# and WDGQ# are common to two adjacent memory arrays MA between adjacent block units BU, respectively.

Word driver zone WDGQ# arranged between memory arrays MA0 and MA1 controls word lines connected to the gates of port Q side transistors of memory cells MC on the both sides of adjacent memory arrays MA0 and MA1 in accordance with driver control signal DQS. In addition, word driver zone WDGP# arranged between memory arrays MA1 and MA2 controls word lines connected to the gates of port P side transistors of memory cells MC on the both sides of adjacent memory arrays MA0 and MA1 in accordance with driver control signal DPS.

By adopting this configuration, therefore, it is possible to reduce the area of the word driver zones which occupy an entire chip and to further reduce a layout area as a whole.

(Fourth Embodiment)

In the second and third embodiments, the configuration in which external pins, i.e., input/output pins DP and DQ and address command pins ADD/COMP and ADD/COMQ are arranged in the four sides of the chip of semiconductor memory device 1000, respectively, has been described. The layout configuration of the chip of a semiconductor memory device in a case where the arrangement of external pins is restricted will now be described.

Figure 12:
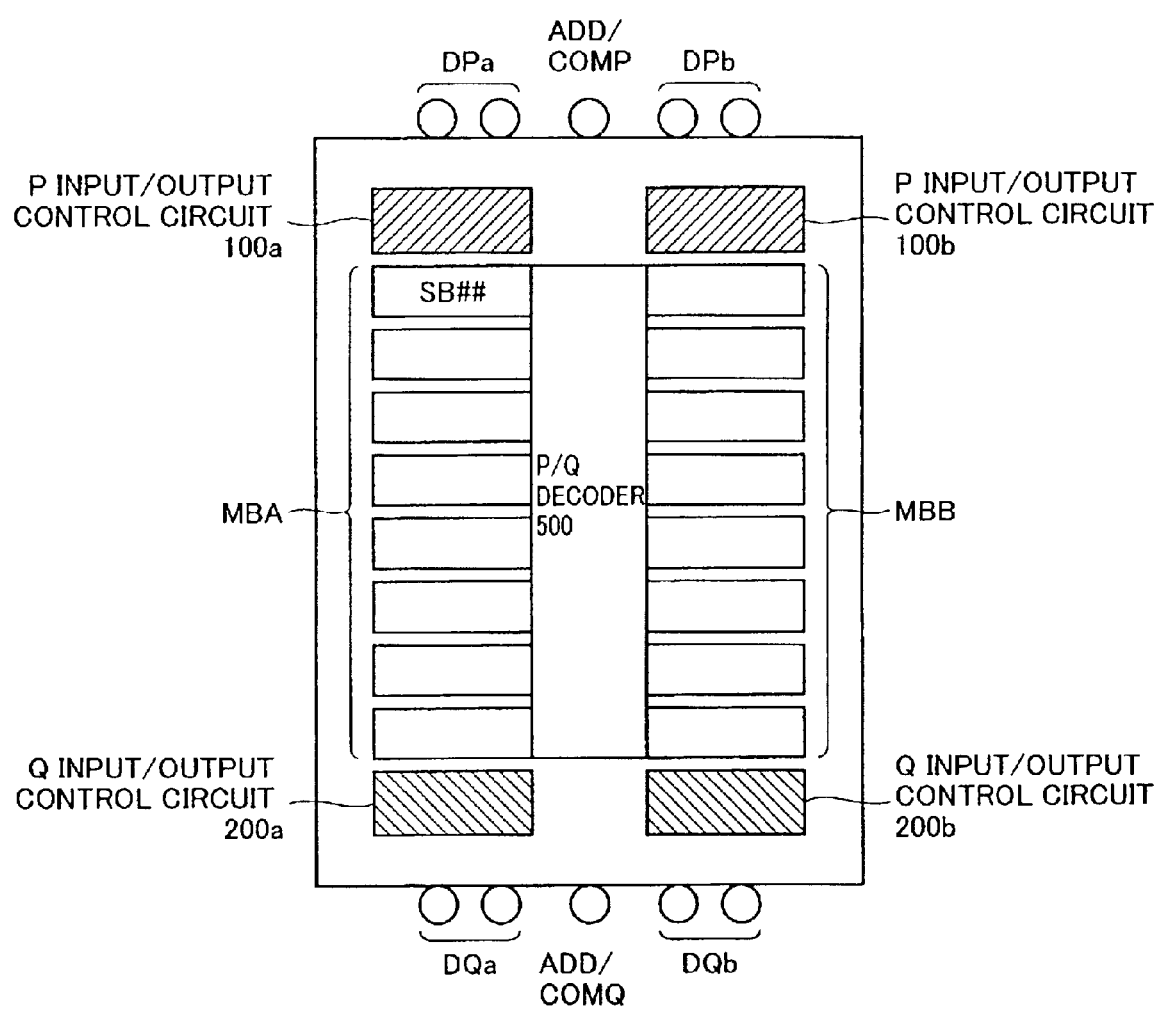
FIG. 12 is a chip layout block diagram of a semiconductor memory device 1010 according to the fourth embodiment of the present invention.

Referring to FIG. 12, a semiconductor memory device 1010 includes main blocks MBA and MBB, P input/output control circuits 100a and 100b, Q input/output control circuits 200a and 200b, P input/output pins DPa and DPb, Q input/output pins DQa and DQb, a P/Q decoder 500, and address command pins ADD/COMP and ADD/COMQ.

According to this configuration, the arrangement of the external pins is restricted to two directions. P/Q decoder 500 is arranged between main blocks MBA and MBB as a decoder common to main blocks MBA and MBB. P/Q decoder 500 functions as both the P decoder for ports P and the Q decoder for ports Q described in the second embodiment. P/Q decoder 500 selects one of sub-memory blocks SB# in accordance with an address and a command and executes a row selection and a column selection for data write and read.

Figure 13:
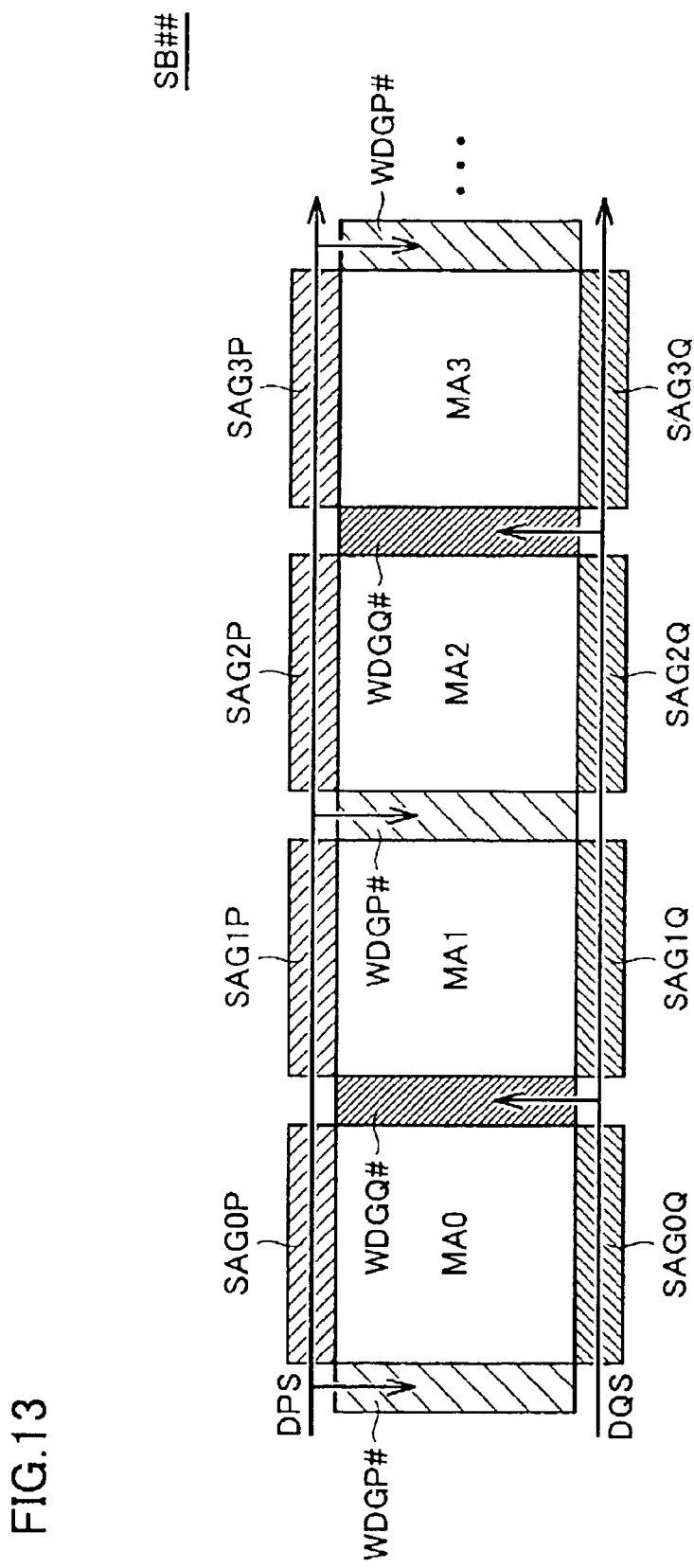
FIG. 13 is a view showing the signal paths of driver control signals DPS and DQS generated by a P/Q decoder 500.
Figure 14:
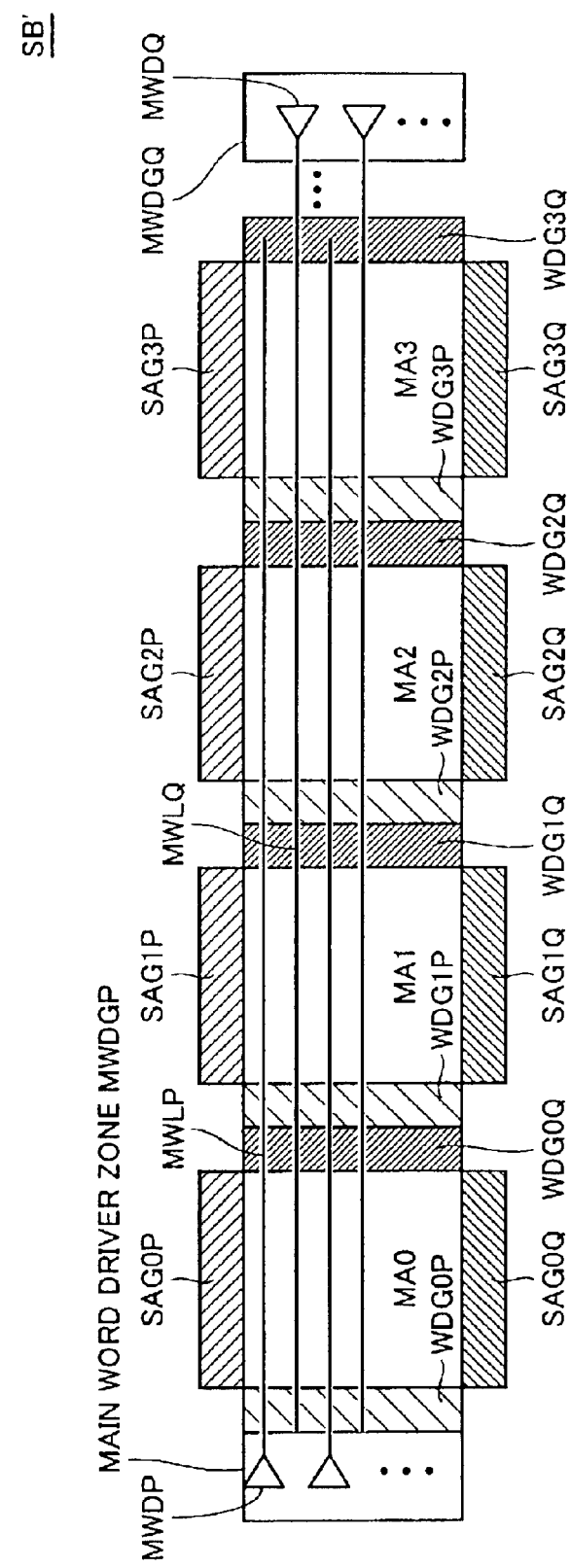
FIG. 14 is a layout block diagram showing that main word driver zones MWDGP and MWDGQ and a plurality of main word lines MWLP and MWLQ are further arranged in sub-memory block SB.

FIG. 13 is a view showing the signal paths of driver control signals DPS and DQS generated by P/Q decoder 500.

Referring to FIG. 13, sub-memory block SB## is the same in layout configuration as the sub-block described with reference to FIG. 11 of the second embodiment.

Sub-memory block SB## differs from sub-block SB# shown in FIG. 11 in that driver control signals DPS and DQS have signal paths in the same direction. Since the other respects are the same, they will not be repeatedly described herein in detail.

Even if this configuration is adopted, it is possible to independently control sense amplifier zones SAGP, SAGQ, word driver zones WDGP# and WDGQ#.

By adopting this configuration, it is possible to easily perform the chip layout of a mass storage memory even if the arrangement of the external pins is restricted.

(Fifth Embodiment)

The fifth embodiment of the present invention is intended to show a layout configuration in which main word lines are added to sub-block SB described with reference to FIG. 3 of the second embodiment and hierarchical word lines are provided.

A sub-block SB' differs from sub-memory block SB described in the second embodiment in that main word driver zones MWDGP and MWDGQ and a plurality of main word lines MWLP and MWLQ are additionally arranged.

Main word driver zones MWDGP and MWDGQ are arranged on the both sides of sub-memory block SB, respectively.

A plurality of main word lines MWLP are arranged to correspond to word lines constituting the same rows in sub-memory block SB and connected to word drivers WDP connected to the corresponding word lines, respectively. Similarly, the plurality of main word lines MWLQ are arranged to correspond to the word lines constituting the same rows in sub-memory block SB and connected to word drivers WDQ connected to the corresponding word lines, respectively.

Main word driver zones MWDGP and MWDGQ include a plurality of main word drivers MWDP and a plurality of main word drivers MWDQ, respectively. A plurality of main word drivers MWDP are connected to a plurality of main word lines MWLP, respectively and a plurality of main word drivers MWDQ are connected to a plurality of main word lines MWLQ, respectively.

According to this configuration, if main word line MWLP is raised, for example, word drivers WDG included in each word driver zones WDGP connected to main word line MWLP are activated for respective block units BU. In other words, the rise of the word lines for respective block units BU are accelerated to thereby accelerate data read and write.

Since the same thing is true for main word lines MWLQ, they will not be repeatedly described herein in detail. It is noted that the configuration of the fifth embodiment is applicable to the layout configuration of the sub-block described in the third embodiment.

MODIFICATION OF FIFTH EMBODIMENT

The modification of the fifth embodiment is intended to provide a layout configuration in which main word lines are further added to sub-block SB## described in the fourth embodiment above and hierarchical word lines are provided.

Figure 15:
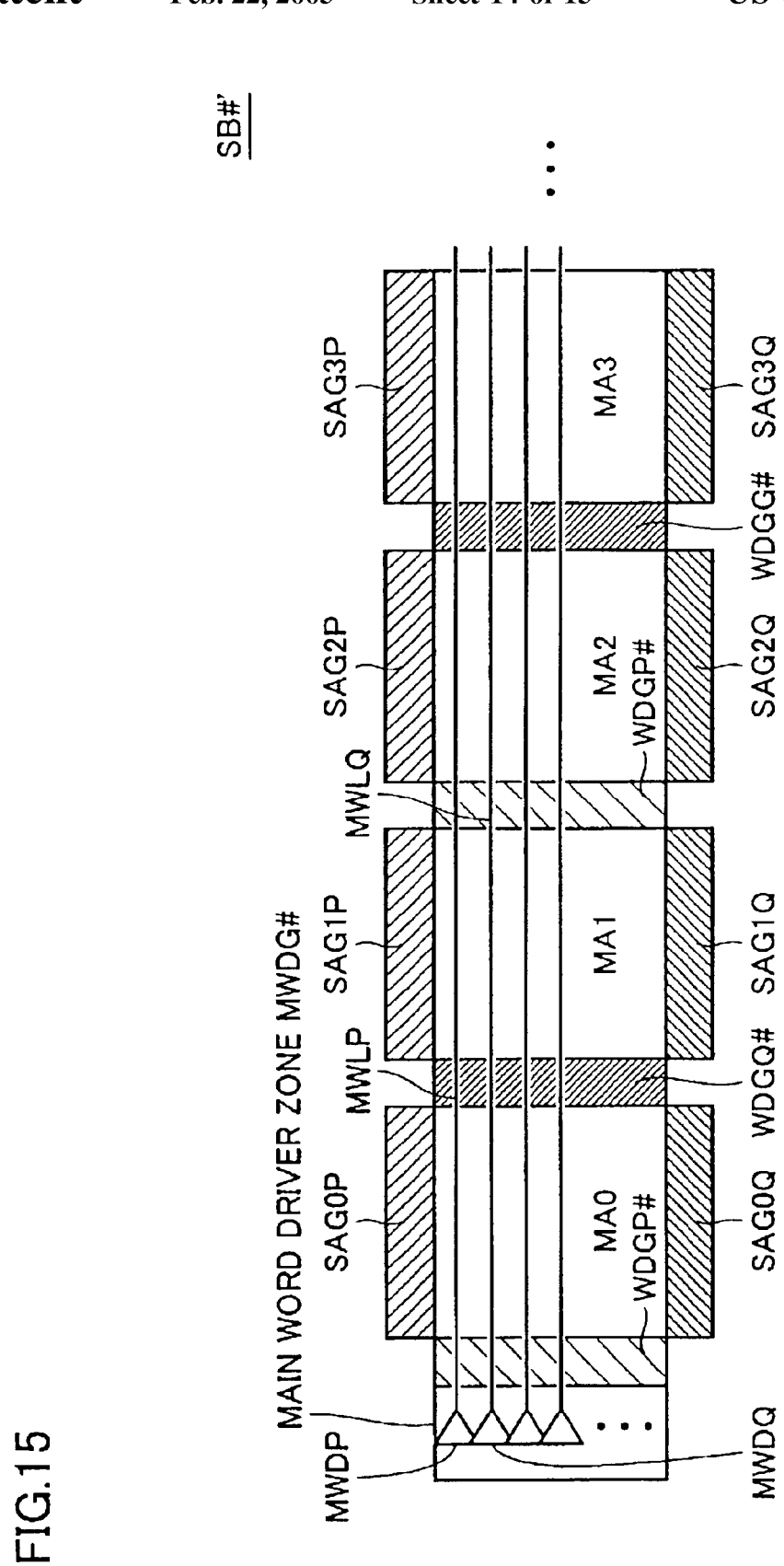
FIG. 15 is a layout block diagram using main word lines according to a modification of the fifth embodiment of the present invention.
Figure 16A:
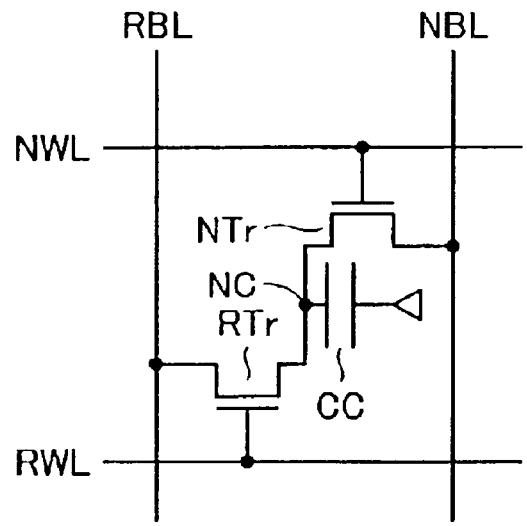
FIGS. 16A and 16B are block diagrams of a conventional two-transistor, one-capacitor type memory cell.
Figure 16B:
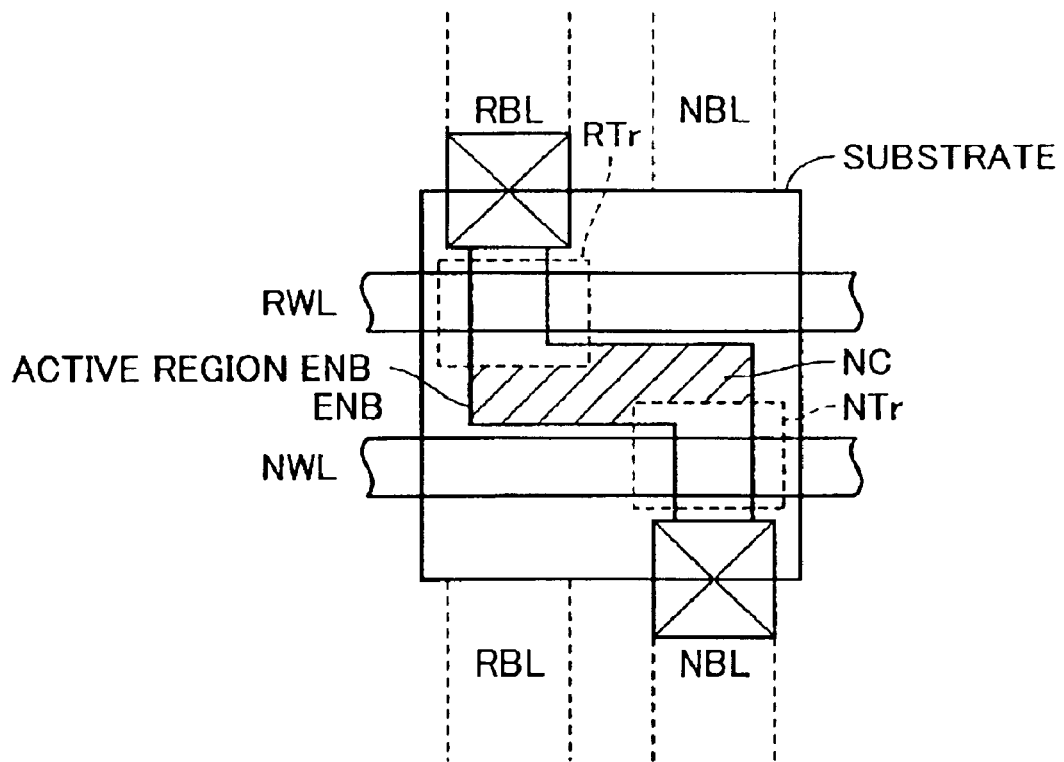

FIG. 15 is a layout block diagram of a sub-block SB#' according to the modification of the fifth embodiment of the present invention.

Referring to FIG. 15, sub-block SB#' differs from sub-block SB## described in the fourth embodiment by further arranging a main word driver zone MWDG# including main word driver zones MWDGP and MWDGQ and a plurality of main word lines MWLP and MWLQ. In addition, main word driver zone MWDG# is arranged on one side of sub-memory block SB## shown in FIG. 13.

According to this configuration, if main word line MWLP is raised, for example, as in the case of the fifth embodiment, respective word driver zones WDGQ# connected to main word lines MWLP are activated. Following this, word drivers WDG included in each word driver zone are activated. In other words, corresponding word lines in two adjacent block units BU arranged on the both sides of word driver WDG, respectively, rise.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory array in which a plurality of memory cells are arranged in a matrix, wherein said memory array includes
a plurality of first and second bit lines provided to correspond to memory cell columns, respectively, and
a plurality of first and second word lines provided to correspond to memory cell rows, respectively;
said semiconductor memory device further comprising:
a plurality of first sense amplifiers connected to at least one of said plurality of first bit lines in a region adjacent to said memory array in a row direction, respectively; and
a plurality of second sense amplifiers connected to at least one of said plurality of second bit lines in a region opposite to said plurality of first sense amplifiers across said memory array, respectively; and wherein
each of said plurality of memory cells has
a first transistor connected between a corresponding one of said plurality of first bit lines and a storage node,
a second transistor connected between a corresponding one of said plurality of second bit lines and said storage node, and
a capacitor connected to said storage node to hold charges as data;
said first and second sense amplifiers are provided to correspond to every two adjacent memory cell columns, respectively,
the first bit line corresponding to one of said two adjacent memory cell columns and the second bit line corresponding to the other of said two adjacent memory cell columns are arranged between said two adjacent memory cell columns,
each of said first sense amplifiers is connected to two out of said plurality of first bit lines that correspond to said two adjacent memory cell columns, and
each of said second sense amplifiers is connected to two out of said plurality of second bit lines that correspond to said two adjacent memory cell columns.

2. The semiconductor memory device according to claim 1, further comprising:
a plurality of first word drivers provided corresponding to said plurality of first word lines, respectively, and arranged in a region adjacent to said memory array in a column direction; and
a plurality of second word drivers provided corresponding to said plurality of second word lines, respectively, and arranged in a region opposite to said plurality of first word drivers across said memory array.

3. The semiconductor memory device according to claim 1, further comprising:
a plurality of first word drivers provided corresponding to said plurality of first word lines, respectively, and arranged in a region adjacent to said memory array in a column direction; and
a plurality of second word drivers provided corresponding to said plurality of second word lines, respectively, and arranged in a region opposite to said plurality of first word drivers across said memory array; wherein
said plurality of first and second word drivers are arranged on first and second word driver zones across said memory array, respectively,
said semiconductor memory device further comprising:
a plurality of memory arrays arranged in a row direction, wherein
said first and second word driver zones are arranged for each of said plurality of memory arrays,
said semiconductor memory device further comprising:
a plurality of first main word lines each provided corresponding in common to each of said first word drivers forming the same row over said plurality of memory arrays, and
a plurality of second main word lines each provided corresponding in common to each of said second word drivers forming the same row over said plurality of memory arrays.

4. The semiconductor memory device according to claim 3, further comprising:
a plurality of first main word drivers provided corresponding to said plurality of first main word lines respectively, and
a plurality of second main word drivers provided corresponding to said plurality of second main word lines respectively, wherein
said plurality of first and second main word drivers are arranged at first and second main word driver zones, respectively,
said first and second main word driver zones are arranged on both sides, respectively, with said plurality of memory arrays arranged between said first and second main word drivers.

5. The semiconductor memory device according to claim 3, further comprising:
plurality of first main word drivers provided to correspond to said plurality of first main word lines, respectively, and
plurality of second main word drivers provided to correspond to said plurality of second main word lines, respectively, wherein
said plurality of first and second main word drivers are arranged at a main word driver zone,
said main word driver zone is arranged on one of two regions between which said plurality of memory arrays are put.

6. A semiconductor memory device comprising:
a memory array in which a plurality of memory cells are arranged in a matrix, wherein
said memory array includes
a plurality of first and second bit lines provided to correspond to memory cell columns, respectively, and
a plurality of first and second word lines provided to correspond to memory cell rows, respectively;
said semiconductor memory device further comprising:
a plurality of first sense amplifiers connected to at least one of said plurality of first bit lines in a region adjacent to said memory array in a row direction, respectively; and
a plurality of second sense amplifiers connected to at least one of said plurality of second bit lines in a region opposite to said plurality of first sense amplifiers across said memory array, respectively; and wherein
each of said plurality of memory cells has
a first transistor connected between a corresponding one of said plurality of first bit lines and a storage node,
a second transistor connected between a corresponding one of said plurality of second bit lines and said storage node, and a capacitor connected to said storage node to hold charges as data; wherein said plurality of first and second sense amplifiers are arranged on two adjacent sense amplifier zones, respectively, in row direction, sandwiching said memory array, said semiconductor memory device further comprising:

first to $N^{th}$ N memory arrays each sharing memory cell columns, and first to $(N+1)^{th}$ (N+1) sense amplifier zones alternately arranged with said N memory arrays on regions, respectively, adjacent to said N memory arrays in a row direction; wherein each of odd-number sense amplifier zones among said N+1 sense amplifier zones includes said plurality of first sense amplifiers, and each of even-number sense amplifier zones among said N+1 sense amplifier zones includes said plurality of second sense amplifiers;

each of said first sense amplifiers is connected to at least one of corresponding said first bit lines arranged in adjacent memory array and each of said first sense amplifiers that is arranged between adjacent two memory arrays is connected to two of corresponding said first bit lines arranged in said adjacent two memory arrays; and each of said second sense amplifiers is connected to at least one of corresponding said second bit lines arranged in adjacent memory array and each of said second sense amplifiers that is arranged between adjacent two memory arrays is connected to two of corresponding said second bit lines arranged in said adjacent two memory arrays.

7. A semiconductor memory device comprising:

a memory array in which a plurality of memory cells are arranged in a matrix, wherein said memory array includes a plurality of first and second bit lines provided to correspond to memory cell columns, respectively, and a plurality of first and second word lines provided to correspond to memory cell rows, respectively;

said semiconductor memory device further comprising:

a plurality of first sense amplifiers connected to at least one of said plurality of first bit lines in a region adjacent to said memory array in a row direction, respectively; and a plurality of second sense amplifiers connected to at least one of said plurality of second bit lines in a region opposite to said plurality of first sense amplifiers across said memory array, respectively; and wherein each of said plurality of memory cells has a first transistor connected between a corresponding one of said plurality of first bit lines and a storage node, a second transistor connected between a corresponding one of said plurality of second bit lines and said storage node, and a capacitor connected to said storage node to hold charges as data; and a plurality of first word drivers provided to correspond to said plurality of first word lines, respectively, a plurality of second word drivers provided to correspond to said plurality of second word lines, respectively, wherein said plurality of first and second word drivers are arranged on two adjacent word driver zones in adjacent column direction, sandwiching said memory array, said semiconductor memory device further comprising, first to $N^{th}$ N memory arrays each sharing memory cell rows, and first to $(N+1)^{th}$ (N+1) word driver zones alternately arranged with said N memory arrays on regions, respectively, adjacent to said N memory arrays in a column direction, wherein each of odd-number word driver zones among said N+1 word driver zones includes said plurality of first word drivers, and each of even-number word driver zones among said N+1 word driver zones includes said plurality of second word drivers, wherein each of said first word drivers is connected to at least one of corresponding said first word lines arranged in adjacent memory array and each of said first word drivers that is arranged between adjacent two memory arrays is connected to two of corresponding said first word lines arranged in said adjacent two memory arrays, each of said second word drivers is connected to at least one of corresponding said second word lines arranged in adjacent memory array and each of said second word drivers that is arranged between adjacent two memory arrays is connected to two of corresponding said second word lines arranged in said adjacent two memory arrays.

8. A semiconductor memory device comprising:

a memory array including a plurality of memory cells arranged in a matrix, wherein each of said plurality of memory cells includes:

a capacitor storing data by accumulating charges; and first and second transistors provided on a shared active region, respectively, and electrically connected between a storage node connected to said capacitor, and a first bit line and between the storage node and a second bit line said first and second lines being arranged to correspond to memory cell columns in parallel to each other, respectively, and wherein gates of said first and second transistors are connected to first and second word lines provided to correspond to memory cell rows along a direction crossing with said first and second bit lines, respectively, and said shared active region is arranged to have an elongate shape along a predetermined axis crossing with said first and second bit lines so as to form a predetermined angle of less than 90 degrees with respect to said first and second bit lines.

9. The semiconductor memory device according to claim 8, wherein said shared active region is arranged to have a rectangular shape along the predetermined axis crossing with said first and second bit lines so as to form the predetermined angle of less than 90 degrees with respect to said first and second bit lines.

* * * * *